United States Patent
Katsuda

(10) Patent No.: US 12,240,986 B2
(45) Date of Patent: Mar. 4, 2025

(54) THERMALLY CURABLE INK-JET INK

(71) Applicant: Konica Minolta, Inc., Tokyo (JP)

(72) Inventor: Ai Katsuda, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 423 days.

(21) Appl. No.: 17/624,435

(22) PCT Filed: Jul. 2, 2019

(86) PCT No.: PCT/JP2019/026355
§ 371 (c)(1),
(2) Date: Jan. 3, 2022

(87) PCT Pub. No.: WO2021/001937
PCT Pub. Date: Jan. 7, 2021

(65) Prior Publication Data
US 2022/0403195 A1 Dec. 22, 2022

(51) Int. Cl.
*C09D 11/38* (2014.01)
*C09D 11/101* (2014.01)
*C09D 11/107* (2014.01)
*H05K 1/09* (2006.01)

(52) U.S. Cl.
CPC ............ *C09D 11/38* (2013.01); *C09D 11/101* (2013.01); *C09D 11/107* (2013.01); *H05K 1/092* (2013.01)

(58) Field of Classification Search
CPC ..... C09D 11/38; C09D 11/101; C09D 11/104; C09D 11/102; C09D 11/34; H05K 1/092
See application file for complete search history.

(56) References Cited

U.S. PATENT DOCUMENTS

2012/0029107 A1  2/2012  Berens et al.

FOREIGN PATENT DOCUMENTS

| | | |
|---|---|---|
| EP | 1624001 A1 | 2/2006 |
| EP | 2620479 A1 | 7/2013 |
| JP | 2011057751 A | 3/2011 |
| JP | 4936725 B2 | 5/2012 |
| JP | 2012521386 A | 9/2012 |
| JP | 2013203830 A | 10/2013 |
| JP | 5731746 B2 | 6/2015 |
| JP | 2016069571 A | 5/2016 |
| JP | 2016069580 A | 5/2016 |
| JP | 5969208 B2 | 8/2016 |
| JP | 2017179130 A | 10/2017 |
| WO | 2019021639 A1 | 1/2019 |

OTHER PUBLICATIONS

Machine English translation of CN 101544104A (Year: 2009).*
PCT International Preliminary Report on Patentability with Written Opinion of the International Searching Authority for corresponding International Application No. PCT/JP2019/026355; Issued on Dec. 28, 2021.
CNIPA The First Office Action for corresponding CN Application No. 201980097968.1; Issued on Jul. 4, 2022.
CNIPA 3rd Office Action for corresponding CN Application No. 201980097968.1; Issued on May 16, 2023.
International Search Report for International Application No. PCT/JP2019/026355; Date of Mailing; Sep. 17, 2019.
TIPO Office Action for corresponding TW Application No. 109114110; Issued on Feb. 18, 2021.
JPO Notice of Reasons for Refusal for corresponding JP Application No. 2021-529608; Mailing Date, Apr. 4, 2023.
JPO Decision of Dismissal of Amendment for corresponding JP Application No. 2021-529608; Issued on Dec. 19, 2023.
JPO Decision of Refusal for corresponding JP Application No. 2021-529608; Dated Dec. 19, 2023.

* cited by examiner

*Primary Examiner* — Jessica M Roswell
(74) *Attorney, Agent, or Firm* — CANTOR COLBURN LLP

(57) ABSTRACT

A thermally curable ink-jet ink includes a compound having a thermally curable functional group and a gelling agent. The thermally curable ink-jet ink undergoes a sol-gel phase transition depending on temperature.

4 Claims, No Drawings

THERMALLY CURABLE INK-JET INK

CROSS REFERENCE TO RELATED APPLICATIONS

This is the U.S. national stage of application No. PCT/JP2019/026355, filed on Jul. 2, 2019. Priority is claimed herewith and the disclosure of which is incorporated herein by reference.

TECHNICAL FIELD

The present invention relates to a thermally curable ink-jet ink, and more particularly to a thermally curable ink-jet ink capable of forming a coating film having excellent substrate adhesion, insulation reliability, a heat and moisture resistance, and various solvent resistances.

BACKGROUND ART

Conventionally, a photolithography development method or a screen printing method has been used for forming an etching resist, a solder resist, and a marking on a printed circuit board.

As a method of producing a printed circuit board using an ink-jet printer, it has already been proposed to form an etching resist by drawing a conductor circuit pattern on a copper-clad laminate for a printed circuit board using an ink-jet printer, and to perform an etching process (for example, see Patent Literature 1). This method can greatly reduce the number of steps and labor as compared with a photolithography development method requiring a photomask and a screen printing method using resist ink or marking ink requiring a screen plate, and can also reduce consumables such as a developer, various inks and a cleaning solvent, and can also reduce waste water, and therefore can be expected to clean the environment.

Regarding the solder resist, it has already been proposed to form a cured film by light and heat using an ink-jet system (for example, see Patent Literatures 2 and 3).

However, in printed circuit boards, adhesion at the interface between the copper foil and the solder resist film under all environments is required, and particularly in these inks using an ink-jet system, there has been a problem of a decrease in adhesion under high-temperature and high-humidity conditions. In addition, there is also a problem of a decrease in insulation properties due to permeation of moisture into the coating film under high-temperature and high-humidity conditions, and it is required to secure coating film performance of heat resistance, moisture resistance, and various solvent resistances required for printed circuit boards.

CITATION LIST

Patent Literature

Patent Literature 1: Japanese Patent No. 5731746
Patent Literature 2: Japanese Patent No. 04936725
Patent Literature 3: Japanese Patent No. 05969208

SUMMARY OF INVENTION

Technical Problem

The present invention has been made in view of the above-described problems and circumstances, and an object thereof is to provide a thermally curable ink-jet ink having excellent substrate adhesion, capable of improving insulation reliability under high-temperature and high-humidity conditions, and capable of forming a coating film having an excellent heat and moisture resistance and various solvent resistances.

Solution to Problem

In order to solve the above problems, the present inventors has found in the process of examining the causes, etc., of the problems that it is possible to provide a thermally curable ink-jet ink capable of forming a coating film having excellent substrate adhesion, insulation reliability, a heat and moisture resistance, and various solvent resistances by using a sol-gel phase transition ink containing a compound having a thermally curable functional group and a gelling agent, thereby completing the present invention.

That is, the above problems according to the present invention are solved by the following means.

1. A thermally curable ink-jet ink comprising: a compound having a thermally curable functional group; and a gelling agent, wherein the thermally curable ink-jet ink undergoes a sol-gel phase transition depending on temperature.

2. The thermally curable ink-jet ink according to item 1, which comprises a compound having a photopolymerizable functional group and a photopolymerization initiator.

3. The thermally curable ink-jet ink according to item 1 or 2, wherein the thermally curable functional group is at least one selected from the group consisting of a hydroxy group, a carboxy group, an isocyanate group, an epoxy group, a (meth)acrylic group, a maleimide group, a mercapto group, and an alkoxy group.

4. The thermally curable ink jet ink according to any one of items 1 to 3, wherein the compound having a thermally curable functional group is a polyfunctional isocyanate compound having an isocyanate group protected by a thermally dissociable blocking agent.

5. The thermally curable ink-jet ink according to item 4, wherein the thermally dissociable blocking agent is at least one compound selected from the group consisting of an oxime-based compound, a pyrazole-based compound, and an active ethylene-based compound.

6. The thermally curable ink-jet ink according to any one of items 1 to 3, wherein the compound having a thermally curable functional group is a (meth)acrylate compound having an imide group.

7. The thermally curable ink jet ink according to any one of items 1 to 6, wherein the ink has a viscosity at 25° C. in the range of 1 to $1\times10^4$ Pa·s, and a phase transition point of 40° C. or more and less than 100° C.

8. The thermally curable ink-jet ink according to any one of items 1 to 7, wherein the gelling agent is at least one compound selected from compounds represented by the following general formula (G1) or (G2):

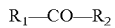 General formula (G1):

 General formula (G2):

wherein $R_1$ to $R_4$ each independently represent an alkyl chain having a linear portion having 12 or more carbon atoms and optionally having a branch.

9. The thermally curable ink-jet ink according to any one of items 1 to 8, which is an ink for forming a solder resist pattern used for a printed circuit board.

Advantageous Effects of Invention

By the above means of the present invention, it is possible to provide a thermally curable ink-jet ink having excellent substrate adhesion, capable of improving insulation reliability under high-temperature and high-humidity conditions, and capable of forming a coating film having an excellent heat and moisture resistance and various solvent resistances.

The expression mechanism or action mechanism of the effect of the present invention is not clear, but is presumed as follows.

In the present invention, the thermally curable ink-jet ink contains a gelling agent, thereby preventing permeation of moisture. As a result, it is possible to suppress a decrease in substrate adhesion under high-temperature and high-humidity conditions and improve insulation reliability of the coating film formed on the substrate using the thermally curable ink-jet ink. Further, it is possible to secure coating film performance of a heat and moisture resistance and various solvent resistances.

In particular, by using the thermally curable ink-jet ink of the present invention as an ink for forming a solder resist, the effects of the present invention can be effectively demonstrated.

That is, the hydrophobic gelling agent in the ink-jet ink of the present invention prevents moisture from permeating into the solder resist film under high-temperature and high-humidity conditions, and as a result, the oxidation of the copper foil can be suppressed, and the deterioration of the adhesion between the copper foil and the solder resist film interface can be prevented. Further, since the permeation of moisture into the solder resist film can be suppressed, it is presumed that the migration of copper can be prevented and a decrease in insulation properties can be suppressed.

DESCRIPTION OF EMBODIMENTS

A thermally curable ink-jet ink according to the present invention includes both a compound having a thermally curable functional group and a gelling agent and undergoes a sol-gel phase transition depending on temperature.

This feature is a technical feature common to or corresponding to each embodiment described below.

In an embodiment of the present invention, it is preferable to contain a compound having a photopolymerizable functional group and a photopolymerization initiator in that the applied coating solution can be temporarily cured by light irradiation, the wetting spread of the coating solution can be suppressed, and a highly accurate pattern can be formed.

The thermally curable functional group is preferably at least one selected from the group consisting of a hydroxy group, a carboxy group, an isocyanate group, an epoxy group, a (meth)acrylic group, a maleimide group, a mercapto group, and an alkoxy group, in terms of thermal curability.

The compound having a thermally curable functional group is preferably a polyfunctional isocyanate compound having an isocyanate group protected by a thermally dissociable blocking agent, in terms of improving high-temperature and high-humidity resistance.

The thermally dissociable blocking agent is preferably at least one compound selected from the group consisting of an oxime-based compound, a pyrazole-based compound, and an active ethylene-based compound in terms of ink storage stability and thermal dissociability.

The compound having a thermally curable functional group is preferably a (meth)acrylate compound having an imide group in terms of improving metal adhesion and high-temperature and high-humidity resistance.

The viscosity at 25° C. is preferably in the range of 1 to $1 \times 10^4$ P·s from the viewpoint that the ink is sufficiently gelled and the pinning property becomes good when the ink is landed and the temperature is decreased to normal temperature. Further, the ink preferably has a phase transition point at 40° C. or more and less than 100° C., and when the phase transition point is 40° C. or more, since the ink rapidly gels after landing on the recording medium, the pinning property becomes higher, and when the phase transition point is less than 100° C., the ink handling property becomes good and the ejection stability is improved.

The gelling agent is preferably at least one compound selected from the compounds represented by the general formula (G1) or (G2) in that pinning property is good, drawing in which thin lines and film thicknesses are both achieved can be performed, and thin line reproducibility is excellent.

The ink for forming a solder resist pattern used for printed circuit boards can prevent the permeation of moisture into the solder resist film when the solder resist film is formed. As a result, the adhesion between the copper foil and the solder resist film interface on the printed circuit board becomes good, the migration of copper is prevented, and a decrease in insulation properties can also be suppressed.

Hereinafter, the present invention, components thereof, and modes and aspects for carrying out the present invention will be described. In the present application, "to" is used in the sense of including a numerical value described before and after it as a lower limit value and an upper limit value.

[Thermally Curable Ink-Jet Ink]

A thermally curable ink-jet ink according to the present invention (hereinafter, also simply referred to as the ink) includes both a compound having a thermally curable functional group and a gelling agent and undergoes a sol-gel phase transition depending on temperature.

Further, the thermally curable ink-jet ink of the present invention contains a compound having a polymerizable functional group and a photopolymerization initiator.

<Compound Having Thermally Curable Functional Group>

Examples of the thermally curable functional group according to the present invention include functional groups cited in reviews such as "Netsu-kokasei ko-bunshi no seimitsuka" (corresponding to "Refinement of Thermally Curable Polymers" in Japanese) (Takeshi Endo, CMC Co., Ltd., 1986)", "Saishin bainda gijutsu binran" (corresponding to "Latest Binder Technology Handbook" in Japanese), Chapter II-I (Yuji Harasaki, General Technology Center, 1985), "Akuriru jushi no gosei sekkei to shin yoto kaihatsu" (corresponding to "Synthesis, Design and New Application Development of Acrylic Resins" in Japanese) (Takayuki Ohtsu, Central Management and Development Center Press, 1985), and "Kinosei akuriru-kei jushi" (corresponding to "Functional Acrylic Resins" in Japanese" (Eizo Omori, Techno System, 1985). Specifically, the thermally curable functional group is preferably at least one selected from the group consisting of a hydroxy group, a carboxy group, an isocyanate group, an epoxy group, a (meth)acrylic group, a maleimide group, a mercapto group, and an alkoxy group, in terms of thermal curability.

(Hydroxy Group)

Examples of the compound having a hydroxy group include various hydroxy group-containing (meth)acrylates (for example, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, polyethylene glycol mono(meth)acrylate, polypropylene glycol mono(meth)acrylate), addition reaction products of the various hydroxy group-containing (meth)acrylates with ε-caprolactone, various hydroxy group-containing vinyl ethers (for example, 2-hydroxyethyl vinyl ether, 3-hydroxypropyl vinyl ether, 2-hydroxypropyl vinyl ether, 4-hydroxybutyl vinyl ether, 3-hydroxybutyl vinyl ether, 2-hydroxy-2-methylpropyl vinyl ether, 5-hydroxypentyl vinyl ether, 6-hydroxyhexyl vinyl ether), addition reaction products of the various hydroxy group-containing vinyl ethers with ε-caprolactone, various hydroxy group-containing allyl ethers (for example, 2-hydroxyethyl (meth)allyl ether, 3-hydroxypropyl (meth) allyl ether, 2-hydroxypropyl (meth)allyl ether, 4-hydroxybutyl (meth)allyl ether, 3-hydroxybutyl (meth)allyl ether, 2-hydroxy-2-methylpropyl (meth)allyl ether, 5-hydroxypentyl (meth)allyl ether, 6-hydroxyhexyl (meth)allyl ether), and addition reaction products of the various hydroxy group-containing allyl ethers with ε-caprolactone.

(Carboxy Group)

Examples of the compound having a carboxy group include various carboxy group-containing monomers (for example, (meth)acrylic acid, crotonic acid, itaconic acid, maleic acid, fumaric acid), monoesters of various α,β-unsaturated dicarboxylic acids and monohydric alcohols having 1 to 18 carbon atoms (for example, monomethyl fumarate, monoethyl fumarate, monobutyl fumarate, monoisobutyl fumarate, monotert-butyl fumarate, monohexyl fumarate, monooctyl fumarate, mono2-ethylhexyl fumarate, monomethyl maleate, monoethyl maleate, monobutyl maleate, monoisobutyl maleate, monotert-butyl maleate, monohexyl maleate, monooctyl maleate, mono2-ethylhexyl maleate), and monoalkyl itaconic acid esters (for example, monomethyl itaconate, monoethyl itaconate, monobutyl itaconate, monoisobutyl itaconate, monohexyl itaconate, monooctyl itaconate, mono2-ethylhexyl itaconate).

Further, examples thereof include carboxy group-containing acrylate compounds, which can be obtained, for example, by copolymerizing an unsaturated carboxylic acid such as acrylic acid, methacrylic acid, itaconic acid, maleic acid and their anhydrides with an acrylic monomer, and among the unsaturated carboxylic acids, acrylic acid and methacrylic acid are preferably used. Examples of the acrylic monomers constituting the carboxylic acid group-containing acrylic copolymer include isoamyl (meth)acrylate, 2-ethylhexyl (meth)acrylate, isooctyl (meth)acrylate, isononyl (meth)acrylate, isomyristyl (meth)acrylate methyl (meth)acrylate, ethyl (meth)acrylate, butyl (meth)acrylate, 2-hydroxyethyl (meth)acrylate, 2-hydroxypropyl (meth) acrylate, hydroxybutyl (meth)acrylate, hydroxyhexyl (meth) acrylate, N-methylol (meth)acrylamide, glycidyl (meth) acrylate, (meth)acrylamide, N,N-dimethyl (meth) acrylamide, (meth)acryloylmorpholine, (meth)acetonitrile, vinylpyrrolidone, N-cyclohexylmaleimide, itaconeimide, and N,N-dimethylaminoethyl (meth)acrylamide. Further, vinyl acetate, styrene and the like can also be used. These monomers may be used alone or in combination of two or more.

(Isocyanate Group)

The compound having an isocyanate group is not particularly limited as long as it is a compound having two or more isocyanate groups in the molecule, and specific examples thereof include: aromatic polyisocyanates such as 2,4-tolylene diisocyanate (2,4-TDI), 2,6-tolylene diisocyanate (2,6-TDI), 4,4'-diphenylmethane diisocyanate (4,4'-MDI), 2,4'-diphenylmethane diisocyanate 1,4-phenylene diisocyanate, xylylene diisocyanate (XDI), tetramethylxylylene diisocyanate (TMXDI), tridine diisocyanate (TODI), 1,5-naphthalene diisocyanate (NDI); aliphatic polyisocyanates such as hexamethylene diisocyanate (HDI), trimethylhexamethylene diisocyanate (TMHDI), lysine diisocyanate, and norbornane diisocyanate methyl (NBDI); alicyclic polyisocyanates such as transcyclohexane-1,4-diisocyanate, isophorone diisocyanate (IPDI), H6XDI (hydrogenated XDI), H12MDI (hydrogenated MDI), and H6TDI (hydrogenated TDI); polyisocyanates such as polymethylene polyphenylene polyisocyanates; burette, isocyanurate, and carbodiimide modified products thereof; and so on.

The acrylate or methacrylate compound having an isocyanate group may have an isocyanate group and an acryloyl group or a methacryloyl group in the molecule, and 2-acryloyloxyethyl isocyanate, 2-methacryloyloxyethyl isocyanate, 2-isocyanate ethyl acrylate, 3-isocyanate propyl acrylate, 2-isocyanate ethyl methacrylate, 3-isocyanate propyl methacrylate, as well as a reaction product of a hydroxyalkyl acrylate such as hydroxyethyl acrylate or a methacrylate with a polyisocyanate such as tolylene diisocyanate, and the like may be used.

The compound having an isocyanate group is preferably a polyfunctional isocyanate compound having an isocyanate group protected by a thermally dissociable blocking agent, in terms of improving high-temperature and high-humidity resistance.

In the case of a polyfunctional isocyanate compound having an isocyanate group protected by a blocking agent, the isocyanurate ring formed from the trimerization reaction of isocyanate has higher thermal stability of the bond and better heat resistance than urethane and urea bonds, and in the case of using a polyfunctional isocyanate compound, a network structure having an isocyanurate ring is further formed, the heat resistance is further improved, and the effect of humidity at high temperature is reduced.

The thermally dissociable blocking agent is preferably at least one compound selected from the group consisting of an oxime-based compound, a pyrazole-based compound, and an active ethylene-based compound in terms of ink storage stability and thermal dissociability.

Examples of the oxime-based compound include formamide oxime, acetoaldoxime, acetoxime, methylethylketone oxime, and cyclohexanone oxime.

Examples of the pyrazole-based compound include pyrazole, 3-methylpyrazole, and 3,5-dimethylpyrazole.

Examples of the active ethylene-based compound include dimethyl malonate, diethyl malonate, methyl acetoacetate, ethyl acetoacetate, and acetylacetone.

Examples of the polyfunctional isocyanate compound having an isocyanate group protected by a blocking agent include 2-[(3,5-dimethylpyrazolyl)carbonylamino]ethyl methacrylate, 2-[(3-butylidene)aminooxycarbonylamino] ethyl methacrylate, 2-[(3,5-dimethylpyrazolyl)carbonylamino]ethyl acrylate, and 2-[(3-butylidene)aminooxycarbonylamino]ethyl acrylate.

(Epoxy Group)

Examples of the compound having an epoxy group include various chain type epoxy group-containing monomers (for example, glycidyl (meth)acrylate, β-methylglycidyl (meth)acrylate, glycidyl vinyl ether, allyl glycidyl ether), various (2-oxo-1,3-oxolane) group-containing vinyl monomers (for example, (2-oxo-1,3-oxolane) methyl (meth) acrylate), various alicyclic epoxy group-containing vinyl monomers (for example, 3,4-epoxycyclohexyl (meth)acrylate, 3,4-epoxycyclohexylmethyl (meth)acrylate, 3,4-epoxycyclohexylethyl (meth)acrylate), bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols obtained by adding one or more alkylene oxides to aliphatic polyhydric alcohols such as ethylene glycol, propylene glycol and glycerol; diglycidyl esters of aliphatic long chain dibasic acids; monoglycidyl ethers of aliphatic higher alcohols; monoglycidyl ethers of phenol, cresol, butylphenol or polyether alcohol obtained by adding alkylene oxide thereto; and glycidyl esters of higher fatty acids.

Further, examples of the compound having an epoxy group include a compound having a (meth)acryloyl group and an epoxy group, and a partially (meth)acrylated product of an epoxy compound.

Examples of the compound having a (meth)acryloyl group and an epoxy group include glycidyl (meth)acrylate and 4-hydroxybutyl (meth)acrylate glycidyl ether.

The partially (meth)acrylated product of an epoxy compound is obtained by reacting an epoxy compound with (meth)acrylic acid in the presence of a catalyst according to a conventional method. Examples of the epoxy compound which can be used for the partially (meth)acrylated product of an epoxy compound include a novolac type epoxy compound and a bisphenol type epoxy compound. Examples of the novolac type epoxy compound include a phenol novolac type epoxy compound, a cresol novolac type epoxy compound, a biphenyl novolac type epoxy compound, a trisphenol novolac type epoxy compound, and a dicyclopentadiene novolac type epoxy compound. Examples of the bisphenol type epoxy compound include a bisphenol A type epoxy compound, a bisphenol F type epoxy compound, a 2,2'-diallyl bisphenol A type epoxy compound, a hydrogenated bisphenol type epoxy compound, and a polyoxypropylene bisphenol A type epoxy compound. By appropriately changing the blending amount of the epoxy compound and (meth)acrylic acid, it is possible to obtain an epoxy compound having a desired acrylicization rate.

((Meth)Acrylic Group)

"(Meth)Acrylic group" means an acrylic group or a methacrylic group.

Examples of the compound having a (meth)acrylic group include: monofunctional acrylates, including isoamyl (meth)acrylate, stearyl (meth)acrylate, lauryl (meth)acrylate, octyl (meth)acrylate, decyl (meth)acrylate, isomyristyl (meth)acrylate, isostearyl (meth)acrylate, 2-ethylhexyl-diglycol (meth)acrylate, 2-hydroxybutyl (meth)acrylate, 2-(meth)acryloyloxyethyl hexahydrophthalic acid, butoxyethyl (meth)acrylate, ethoxydiethylene glycol (meth)acrylate, methoxydiethylene glycol (meth)acrylate, methoxypolyethylene glycol (meth)acrylate, methoxypropylene glycol (meth)acrylate, phenoxyethyl (meth)acrylate, tetrahydrofurfuryl (meth)acrylate, isobornyl (meth)acrylate, 2-hydroxyethyl (meth)acrylate, 2-hydroxypropyl (meth)acrylate, 2-hydroxy-3-phenoxypropyl (meth)acrylate, 2-(meth)acryloyloxyethylsuccinic acid, 2-(meth)acryloyloxyethylphthalic acid, 2-(meth)acryloyloxyethyl-2-hydroxyethyl-phthalic acid, and t-butylcyclohexyl (meth)acrylate;

difunctional acrylates, including triethylene glycol di(meth)acrylate, tetraethylene glycol di(meth)acrylate, polyethylene glycol di(meth)acrylate, tripropylene glycol di(meth)acrylate, polypropylene glycol di(meth)acrylate, 1,4-butanediol di(meth)acrylate, 1,6-hexanediol di(meth)acrylate, 1,9-nonanediol di(meth)acrylate, neopentyl glycol di(meth)acrylate, dimethylol tricyclodecane di(meth)acrylate, bisphenol A PO adduct di(meth)acrylate, neopentyl glycol di(meth)acrylate hydroxypivalate, polytetramethylene glycol di(meth)acrylate, polyethylene glycol diacrylate, tripropylene glycol diacrylate, and tricyclodecanedimethanol diacrylate; and polyfunctional acrylates, including tri- or higher-functional acrylates such as trimethylolpropane tri(meth)acrylate, pentaerythritol tri(meth)acrylate, pentaerythritol tetra(meth)acrylate, dipentaerythritol hexa(meth)acrylate, ditrimethylolpropane tetra(meth)acrylate, glycerol propoxytri(meth)acrylate, and pentaerythritol ethoxytetra(meth)acrylate.

The compound having a (meth)acrylic group is preferably a (meth)acrylate compound having an imide group in terms of improving high-temperature and high-humidity resistance.

In the case of a (meth)acrylate compound having an imide group, strong metal adhesion is obtained because the polarity of the imide group is high. Further, since it also has strong cohesion itself, there is little influence on metal adhesion even under high humidity.

Examples of the (meth)acrylate compound having an imide group include imide acrylate or imide methacrylate described in JP H10-36462A and JP H11-21470.

(Maleimide Group)

Examples of the compound having a maleimide group include N-methylmaleimide, N-ethylmaleimide, N-hexylmaleimide, N-propylmaleimide, N-butylmaleimide, N-octylmaleimide, N-dodecylmaleimide, N-cyclohexylmaleimide, N-phenylmaleimide, N-p-carboxyphenylmaleimide, N-p-hydroxyphenylmaleimide, N-p-chlorophenylmaleimide, N-p-tolylmaleimide, N-p-xylylmaleimide, N-o-chlorophenylmaleimide, N-o-tolylmaleimide, N-benzylmaleimide, N-2,5-diethylphenylmaleimide, N-2,5-dimethylphenylmaleimide, N-m-tolylmaleimide, N-α-naphthylmaleimide, N-o-xylylmaleimide, N-m-xylylmaleimide, bismaleimidomethane, 1,2-bismaleimidoethane, 1,6-bismaleimidohexane, bismaleimidododecane, N,N'-m-phenylenedimaleimide, N,N'-p-phenylenedimaleimide, 4,4'-bismaleimidodiphenyl ether, 4,4'-bismaleimidodiphenylmethane, 4,4'-bismaleimido-di(3-methylphenyl)methane, 4,4'-bismaleimido-di(3-ethylphenyl)methane, 4,4'-bismaleimido-di(3-methyl-5-ethyl-phenyl)methane, N,N'-(2,2-bis-(4-phenoxyphenyl)propane)dimaleimide, N,N'-2,4-tolylenediimide, N,N'-2,6-tolylenedimaleimide, N,N'-m-xylylenedimaleimide, and bisphenol A diphenyl ether bismaleimide.

(Mercapto Group)

Examples of the compound having a mercapto group include ethylthioacrylate, ethylthiomethacrylate, biphenylthioacrylate, biphenylthiomethacrylate, nitrophenylthioacrylate, nitrophenylthiomethacrylate, triphenylmethylthioacrylate, triphenylmethylthiomethacrylate, trisacrylate of 1,2-bis[(2-mercaptoethyl)thio]-3-mercaptopropane, 2-(mercaptomethyl)-methyl ester of 2-propenoic acid, 2-[(2-mercaptoethyl)thio]ethyl ester of methacrylic acid, 1,4-bis(3-mercaptobutyryloxy)butane, and 1,3,5-tris(3-mercaptobutyryloxyethyl)-1,3,5-triazine-2,4,6(1H,3H,5H)-trione.

(Alkoxy Group)

Examples of the compound having an alkoxy group include methoxymethyl acrylate, methoxymethyl methacrylate, dimethoxymethyl acrylate and dimethoxymethyl methacrylate, 1-methoxyethyl acrylate, 1-methoxyethyl methacrylate, 2-methoxyethyl acrylate, 2-methoxyethyl methacrylate, 1,1-methoxyethyl acrylate and 1,1-methoxyethyl methacrylate, 1-ethoxyethyl acrylate, 1-ethoxyethyl methacrylate, 2-ethoxyethyl acrylate and 2-ethoxyethyl methacrylate, N-ethoxymethyl acrylamide, N-ethoxymethyl methacrylamide, ethoxymethyl methacrylate and ethoxymethyl methacrylate, and acrylic modified alkylated melamine.

(Other Functional Groups)

Examples of the thermally curable functional group include compounds having an oxetanyl group and an oxazoline group in addition to the above functional groups.

Examples of the compound having an oxetanyl group include oxetane (meth)acrylate. Examples of commercially available products of such compounds include trade names: OXE-10 and OXE-30 manufactured by OSAKA ORGANIC CHEMICAL INDUSTRY LTD.

Examples of the compound having an oxazoline group include 2-isopropenyl-2-oxazoline, 2-isopropenyl-4-methyl-2-oxazoline, 2-isopropenyl-5-ethyl-2-oxazoline, 2-vinyl-2-oxazoline, 2-vinyl-4-methyl-2-oxazoline, 2-vinyl-5-methyl-2-oxazoline, and monomers having a substituent on the oxazoline group of these oxazoline group-containing monomers.

<Gelling Agent>

The gelling agent according to the present invention is preferably held in a state of being uniformly dispersed in a cured film cured by light and heat, thereby preventing penetration of moisture into the cured film.

Such a gelling agent is preferably at least one compound among compounds represented by the following general formula (G1) or (G2) in that the gelling agent is dispersed in the cured film without inhibiting the curability of the ink. Further, it is also preferable in that pinning property is good, drawing in which thin lines and film thicknesses are both achieved can be performed, and thin line reproducibility is excellent in the ink-jet printing.

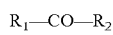  General formula (G1):

  General formula (G2):

wherein $R_1$ to $R_4$ each independently represent an alkyl chain having a linear portion having 12 or more carbon atoms and optionally having a branch.

The ketone wax represented by the general formula (G1) or the ester wax represented by the general formula (G2) has a linear or branched hydrocarbon group (alkyl chain) having 12 or more carbon atoms, so that the crystallinity of the gelling agent is further improved and the water resistance is improved, and a sufficient space is produced in the following card house structure. Therefore, the ink medium such as the solvent and the photopolymerizable compound is sufficiently encapsulated in the space, and the pinning property of the ink is further improved.

Further, it is preferable that the number of carbon atoms of the linear or branched hydrocarbon group (alkyl chain) is 26 or less, and when the number of carbon atoms is 26 or less, the melting point of the gelling agent does not rise excessively, so that it is not necessary to heat the ink excessively when the ink is ejected.

From the above viewpoint, it is particularly preferable that $R_1$ and $R_2$ or $R_3$ and $R_4$ are linear hydrocarbon groups having 12 or more and 23 or less carbon atoms.

Further, from the viewpoint of increasing the gelation temperature of the ink and rapidly gelling the ink after landing, it is preferable that any of $R_1$ or $R_2$ or any of $R_3$ or $R_4$ is a saturated hydrocarbon group having 12 or more and 23 or less carbon atoms.

From the above viewpoint, it is more preferable that both $R_1$ and $R_2$ or both $R_3$ and $R_4$ are saturated hydrocarbon groups having 11 or more and less than 23 carbon atoms.

Examples of the ketone wax represented by the general formula (G1) include dilignoceryl ketone (C24-C24), dibehenyl ketone (C22-C22), distearyl ketone (C18-C18), dieicosyl ketone (C20-C20), dipalmityl ketone (C16-C16), dimyristyl ketone (C14-C14), dilauryl ketone (C12-C12), lauryl myristyl ketone (C12-C14), lauryl palmityl ketone (C12-C16), myristyl palmityl ketone (C14-C16), myristyl stearyl ketone (C14-C18), myristyl behenyl ketone (C14-C22), palmityl stearyl ketone (C16-C18), palmityl behenyl ketone (C16-22), and stearyl behenyl ketone (C18-C22). The carbon number in parentheses represents the carbon number of each of the two hydrocarbon groups separated by the carbonyl group.

Examples of commercially available products of the ketone wax represented by the general formula (G1) include Stearonne (manufactured by Alfa Aeser; stearon), 18-Pentatriacontanon (manufactured by Alfa Aeser), Hentriacontan-16-on (manufactured by Alfa Aeser), and Kao wax T-1 (manufactured by Kao Corporation).

Examples of the fatty acid or ester wax represented by the general formula (G2) include behenyl behenate (C21-C22), icosyl icosanoate (C19-C20), stearyl stearate (C17-C18), palmityl stearate (C17-C16), lauryl stearate (C17-C12), cetyl palmitate (C15-C16), stearyl palmitate (C15-C18), myristyl myristate (C13-C14), cetyl myristate (C13-C16), octyldodecyl myristate (C13-C20), stearyl oleate (C17-C18), stearyl erucate (C21-C18), stearyl linoleate (C17-C18), behenyl oleate (C18-C22), and arachidyl linoleate (C17-C20). The carbon number in parentheses represents the carbon number of each of the two hydrocarbon groups separated by the ester group.

Examples of commercially available products of the ester wax represented by the general formula (G2) include UNISTAR-M-2222SL and SPERMACETI (manufactured by NOF Corporation; "UNISTAR" is a registered trademark of this company), EXCEPARL SS and EXCEPARL MY-M (manufactured by Kao Corporation; "EXCEPARL" is a registered trademark of this company), EMALEX CC-18 and EMALEX CC-10 (manufactured by Nihon Emulsion Co., Ltd.; "EMALEX" is a registered trademark of this company), and AMREPS PC (manufactured by KOKYU ALCOHOL KOGYO CO., LTD.; "AMREPS" is a registered trademark of this company).

Since these commercially available products are often a mixture of two or more types, they may be separated and purified and contained in the ink as necessary. Among these gelling agents, ketone wax, ester wax, higher fatty acid, higher alcohol, and fatty acid amide are preferable from the viewpoint of further enhancing pinning property.

The content of the gelling agent according to the present invention is preferably in the range of 0.5 to 5.0% by mass based on the total mass of the ink. When the content of the gelling agent is within the above range, the solubility and pinning effect of the gelling agent on the solvent component become good, and the water resistance of the cured film is improved. Further, from the above viewpoint, the content of the gelling agent in the ink-jet ink is more preferably in the range of 0.5 to 2.5% by mass.

Further, from the following viewpoints, the gelling agent is preferably crystallized at a temperature equal to or lower than a gelation temperature of the ink. The gelation temperature refers to a temperature at which the gelling agent undergoes a phase transition from sol to gel when an ink solating or liquefying from heating is cooled, causing the viscosity of the ink to abruptly change. Specifically, the solating or liquefying ink is continued to be cooled, while measuring the viscosity thereof using a viscoelasticity meter (for example, MCR300, manufactured by Physica Messtechnik GmbH), and a temperature at which the viscosity is increased abruptly can be set as the gelation temperature of the ink.

<Compound Having Photopolymerizable Functional Group>

The compound having a photopolymerizable functional group according to the present invention (also referred to as a photopolymerizable compound) is The photopolymerizable compound may be any compound having an action of causing polymerization or crosslinking reaction by irradiation with active ray to be polymerized or crosslinked and curing the ink. Examples of the photopolymerizable compound include radically polymerizable compounds and cationically polymerizable compounds. The photopolymerizable compound may be any of a monomer, a polymerizable oligomer, a prepolymer or a mixture thereof. The ink-jet ink may contain only one photopolymerizable compound, or may contain two or more photopolymerizable compounds.

The radically polymerizable compound is preferably an unsaturated carboxylic acid ester compound, more preferably a (meth)acrylate. Examples of such a compound include the compounds having a (meth)acrylic group described above.

The cationic polymerizable compound may be an epoxy compound, a vinyl ether compound, an oxetane compound, or the like. The ink-jet ink may contain only one cationically polymerizable compound, or may contain two or more cationically polymerizable compounds.

<Photopolymerization Initiator>

The photopolymerization initiator according to the present invention preferably uses a photoradical initiator when the photopolymerizable compound is a radically polymerizable compound, and uses a photoacid generator when the photopolymerizable compound is a cationically polymerizable compound.

The ink of the present invention may contain only one photopolymerization initiator, or may contain two or more photopolymerization initiators. The photopolymerization initiator may be a combination of both a photoradical initiator and a photoacid generator.

The photoradical initiator includes cleaving type radical initiators and hydrogen withdrawing type radical initiators.

Examples of the cleaving type radical initiator include acetophenone-based initiators, benzoin-based initiators, acylphosphine-oxide-based initiators, benzyl and methylphenylglyoxyesters.

Examples of the acetophenone-based initiators include diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexylphenyl ketone, 2-methyl-2-morpholino(4-thiomethylphenyl)propan-1-one, and 2-benzyl-2-dimethylamino-1-(4-morpholinophenyl)-butanone.

Examples of the benzoin-based initiator include benzoin, benzoin methyl ether and benzoin isopropyl ether.

Examples of the acylphosphine oxide-based initiator include 2,4,6-trimethylbenzoindiphenylphosphine oxide.

Examples of the hydrogen withdrawing type radical initiators include benzophenone-based initiators, thioxanthone-based initiators, aminobenzophenone-based initiators, 10-butyl-2-chloroacridone, 2-ethylanthraquinone, 9,10 phenanthrene quinone, and camphorquinone.

Examples of the benzophenone-based initiator include benzophenone, methyl-4-phenylbenzophenone o-benzoylbenzoate, 4,4'-dichlorobenzophenone, hydroxybenzophenone, 4-benzoyl-4'-methyl-diphenyl sulfide, acrylated benzophenone, 3,3',4,4'-tetra(t-butylperoxycarbonyl)benzophenone, and 3,3'-dimethyl-4-methoxybenzophenone.

Examples of the thioxanthone-based initiator include 2-isopropylthioxanthone, 2,4-dimethylthioxanthone, 2,4-diethylthioxanthone, and 2,4-dichlorothioxanthone.

Examples of the aminobenzophenone-based initiator include Michler's ketone and 4,4'-diethylaminobenzophenone.

Examples of the photoacid generator include the compounds described in "Organic Materials for Imaging", The Japanese Research Association for Organic Electronics Materials (ed.), Bunshin Publishing (1993), pp. 187-192.

The content of the photopolymerization initiator may be in a range that allows the ink to cure sufficiently, for example, in the range of 0.01 to 10% by mass based on the total mass of the ink of the present invention.

Examples of commercially available products of the photopolymerization initiator include IRGACURE TPO (manufactured by BASF Japan Ltd.), 819 (manufactured by BASF Japan Ltd.), IRGACURE 379 (manufactured by BASF Japan Ltd.), GENOCURE ITX (manufactured by Rahn A.G.), and GENOCURE EPD (manufactured by Rahn A.G.).

The ink of the present invention may further contain a photopolymerization initiator aid, a polymerization inhibitor and the like, as necessary.

The photopolymerization initiator aid may be a tertiary amine compound, which is preferably an aromatic tertiary amine compound.

Examples of the aromatic tertiary amine compound include N,N-dimethylaniline, N,N-diethylaniline, N,N-dimethyl-p-toluidine, N,N-dimethylamino-p-benzoic acid ethyl ester, N,N-dimethylamino-p-benzoic acid isoamyl ethyl ester, N,N-dihydroxyethylaniline, triethylamine, and N,N-dimethylhexylamine. Of these, N,N-dimethylamino-p-benzoic acid ethyl ester and N,N-dimethylamino-p-benzoic acid isoamyl ethyl ester are preferable. These compounds may be used alone or in combination of two or more.

<Colorant>

The ink of the present invention may further contain a colorant, as necessary.

The colorant may be a dye or a pigment, but the pigment is preferred because it has good dispersibility with respect to components of the ink and is excellent in weather resistance. The pigment is not particularly limited, and examples thereof include organic pigments or inorganic pigments having the following numbers described in Color Index.

Examples of red or magenta pigments include pigments selected from Pigment Reds 3, 5, 19, 22, 31, 38, 43, 48:1, 48:2, 48:3, 48:4, 48:5, 49:1, 53:1, 57:1, 57:2, 58:4, 63:1, 81, 81:1, 81:2, 81:3, 81:4, 88, 104, 108, 112, 122, 123, 144, 146, 149, 166, 168, 169, 170, 177, 178, 179, 184, 185, 208, 216, 226, and 257; Pigment Violets 3, 19, 23, 29, 30, 37, 50, and 88; and Pigment Oranges 13, 16, 20, and 36, or mixtures thereof.

Examples of blue or cyan pigments include pigments selected from Pigment Blues 1, 15, 15:1, 15:2, 15:3, 15:4, 15:6, 16, 17-1, 22, 27, 28, 29, 36, and 60, or mixtures thereof.

Examples of green pigments include pigments selected from Pigment Greens 7, 26, 36, and 50, or mixtures thereof.

Examples of yellow pigments include pigments selected from Pigment Yellows 1, 3, 12, 13, 14, 17, 34, 35, 37, 55, 74, 81, 83, 93, 94, 95, 97, 108, 109, 110, 137, 138, 139, 153, 154, 155, 157, 166, 167, 168, 180, 185, and 193, or mixtures thereof.

Examples of black pigments include pigments selected from Pigment Blacks 7, 28, and 26, or mixtures thereof.

Specific examples of commercially available products of the pigment include Black Pigment (manufactured by Mikuni-Color Ltd.) CHROMOFINE YELLOWs 2080, 5900, 5930, AF-1300, and AF-2700L; CHROMOFINE ORANGEs 3700L and 6730; CHROMOFINE SCARLET 6750; CHROMOFINE MAGENTAs 6880, 6886, 6891N, 6790, and 6887; CHROMOFINE VIOLET RE; CHROMOFINE REDs 6820 and 6830; CHROMOFINE BLUEs HS-3, 5187, 5108, 5197, 5085N, SR-5020, 5026, 5050, 4920, 4927, 4937, 4824, 4933GN-EP, 4940, 4973, 5205, 5208, 5214, 5221, and 5000P; CHROMOFINE GREENs 2GN, 2GO, 2G-550D, 5310, 5370, and 6830; CHROMOFINE BLACK A-1103; SEIKAFAST YELLOWs 10GH, A-3, 2035, 2054, 2200, 2270, 2300, 2400(B), 2500, 2600, ZAY-260, 2700(B), and 2770; SEIKAFAST REDs 8040, C405(F), CA120, LR-116, 1531B, 8060R, 1547, ZAW-262, 1537B, GY, 4R-4016, 3820, 3891, and ZA-215; SEIKAFAST CARMINEs 6B1476T-7, 1483LT, 3840, and 3870; SEIKAFAST BORDEAUX 10B-430; SEIKALIGHT ROSE R40; SEIKALIGHT VIOLETs B800 and 7805; SEIKAFAST MAROON 460N; SEIKAFAST ORANGEs 900 and 2900; SEIKALIGHT BLUEs C718 and A612; CYANINE BLUEs 4933M, 4933GN-EP, 4940, and 4973 (manufactured by Dainichiseika Color & Chemicals Mfg. Co., Ltd.); KET Yellows 401, 402, 403, 404, 405, 406, 416, and 424; KET Orange 501; KET Reds 301, 302, 303, 304, 305, 306, 307, 308, 309, 310, 336, 337, 338, and 346; KET Blues 101, 102, 103, 104, 105, 106, 111, 118, and 124; KET Green 201 (manufactured by DIC Corporation), Colortex Yellows 301, 314, 315, 316, P-624, 314, U10GN, U3GN, UNN, UA-414, and U263; Finecol Yellows T-13 and T-05; Pigment Yellow 1705; Colortex Orange 202, Colortex Reds 101, 103, 115, 116, D3B, P-625, 102, H-1024, 105C, UFN, UCN, UBN, U3BN, URN, UGN, UG276, 0456, 0457, 105C, and USN; Colortex Maroon 601; Colortex Brown B610N; Colortex Violet 600; Pigment Red 122; Colortex Blues 516, 517, 518, 519, A818, P-908, and 510; Colortex Greens 402 and 403; Colortex Blacks 702 and U905 (manufactured by Sanyo Color Works. LTD.); Lionol Yellow 1405G; Lionol Blues FG7330, FG7350, FG7400G, FG7405G, ES, and ESP-S (manufactured by Toyo Ink SC Holdings Co., Ltd.); Toner Magenta E02; Permanent Rubin F6B; Toner Yellow HG; Permanent Yellow GG-02; Hostaperm Blue B2G (manufactured by Hoechst Industry Ltd.); Novoperm P-HG; Hostaperm Pink E; Hostaperm Blue B2G (manufactured by Clariant International Ltd.); and Carbon Blacks #2600, #2400, #2350, #2200, #1000, #990, #980, #970, #960, #950, #850, MCF88, #750, #650, MA600, MA7, MA8, MA11, MA100, MA100R, MA77, #52, #50, #47, #45, #45L, #40, #33, #32, #30, #25, #20, #10, #5, #44, and CF9 (manufactured by Mitsubishi Chemical Corporation).

The pigments may be dispersed, for example, with a ball mill, a sand mill, an attritor, a roll mill, an agitator, a Henschel mixer, a colloid mill, an ultrasonic homogenizer, a pearl mill, a wet jet mill, or a paint shaker.

The pigment is preferably dispersed so that the volume average particle size of the pigment particles is preferably in the range of 0.08 to 0.5 µm and a maximum diameter of 0.3 to 10 µm, more preferably 0.3 to 3 µm.

The dispersion of the pigment is adjusted by the selection of the pigment, the dispersant, and the dispersion medium, the dispersion conditions, the filtration conditions, and the like.

The ink of the present invention may further contain a dispersant in order to enhance the dispersibility of the pigment.

Examples of the dispersant include carboxylic acid esters having a hydroxy group, salts of long chain polyamino amide and high molecular weight acid ester, salts of high molecular weight polycarboxylic acid, salts of long chain polyamino amide and polar acid ester, high molecular weight unsaturated acid esters, polymer copolymers, modified polyurethanes, modified polyacrylates, polyether ester type anion activators, naphthalene sulfonic acid formalin condensate salts, aromatic sulfonic acid formalin condensate salts, polyoxyethylene alkyl phosphate esters, polyoxyethylene nonyl phenyl ethers, and stearyl amine acetates. Examples of commercially available products of the dispersant include Avecia's Solsperse series and Ajinomoto Fine-Techno Co., Inc.'s PB series.

The ink of the present invention may further contain a dispersion aid, as necessary. The dispersion aid may be selected according to the pigment.

The total amount of the dispersant and the dispersion aid is preferably in the range of 1 to 50% by mass based on the pigment.

The ink of the present invention may further contain a dispersion medium for dispersing the pigment, as necessary. Although the ink may contain a solvent as the dispersion medium, it is preferable to use a photopolymerizable compound as described above (especially a monomer having a low viscosity) as the dispersion medium in order to suppress the residual solvent in the formed image.

Examples of the dye include oil-soluble dyes.

Examples of the oil-soluble dye include the following various dyes. Examples of magenta dyes include MS Magenta VP, MS Magenta HM-1450, MS Magenta HSo-147 (all manufactured by Mitsui Chemicals, Inc.), AIZENSOT Red-1, AIZEN SOT Red-2, AIZEN SOT Red-3, AIZEN SOT Pink-1, and SPIRON Red GEH SPECIAL (all manufactured by Hodogaya Chemical Co., Ltd.); RESOLIN Red FB 200%, MACROLEX Red Violet R, and MACROLEX ROT5B (all manufactured by Bayer); KAYASET Red B, KAYASET Red 130, and KAYASET Red 802 (all manufactured by Nippon Kayaku Co., Ltd.); PHLOXIN, ROSE BENGAL, and ACID Red (all manufactured by Daiwa Dyestuff Mfg. Co., Ltd.); HSR-31 and DIARESIN Red K (all manufactured by Mitsubishi Chemical Corporation); and Oil Red (manufactured by BASF Japan Ltd.).

Examples of cyan dyes include MS Cyan HM-1238, MS Cyan HSo-16, Cyan HSo-144, and MS Cyan VPG (all manufactured by Mitsui Chemicals, Inc.); AIZEN SOT Blue-4 (manufactured by Hodogaya Chemical Co., Ltd.); RESOLIN BR.Blue BGLN 200%, MACROLEX Blue RR, CERES Blue GN, SIRIUS SUPRA TURQ.Blue Z-BGL, and SIRIUS SUPRA TURQ.Blue FB-LL 330% (all manufactured by Bayer); KAYASET Blue FR, KAYASET Blue N, KAYASET Blue 814, Turq.Blue GL-5 200, and Light Blue BGL-5 200 (all manufactured by Nippon Kayaku Co., Ltd.); DAIWA Blue 7000 and Oleosol Fast Blue GL (all manufactured by Daiwa Dyestuff Mfg. Co., Ltd.); DIARESIN Blue P (manufactured by Mitsubishi Chemical Corporation); and SUDAN Blue 670, NEOPEN Blue 808, and ZAPON Blue 806 (all manufactured by BASF Japan Ltd.).

Examples of yellow dyes include MS Yellow HSm-41, Yellow KX-7, and Yellow EX-27 (manufactured by Mitsui Chemicals, Inc.); AIZEN SOT Yellow-1, AIZEN SOT Yellow-3, and AIZEN SOT Yellow-6 (all manufactured by Hodogaya Chemical Co., Ltd.); MACROLEX Yellow 6G and MACROLEX FLUOR.Yellow 10GN (all manufactured by Bayer); KAYASET Yellow SF-G, KAYASET Yellow 2G, KAYASET Yellow A-G, and KAYASET Yellow E-G (all manufactured by Nippon Kayaku Co., Ltd.); DAIWA Yellow 330HB (manufactured by Daiwa Dyestuff Mfg. Co., Ltd.); HSY-68 (manufactured by Mitsubishi Chemical Corporation); and SUDAN Yellow 146 and NEOPEN Yellow 075 (all manufactured by BASF Japan Ltd.).

Examples of black dyes include MS Black VPC (Mitsui Chemicals, Inc.); AIZEN SOT Black-1 and AIZEN SOT Black-5 (all manufactured by Hodogaya Chemical Co., Ltd.); RESORIN Black GSN 200% and RESOLIN BlackBS (all manufactured by Bayer); KAYASET Black A-N (manufactured by Nippon Kayaku Co., Ltd.); DAIWA Black MSC (manufactured by Daiwa Dyestuff Mfg. Co., Ltd.); HSB-202 (manufactured by Mitsubishi Chemical Corporation); and NEPTUNE Black X60 and NEOPEN Black X58 (manufactured by BASF Japan Ltd.).

The ink of the present invention may contain one or more colorants and may be toned to a desired color.

The content of the colorant is preferably in the range of 0.1 to 20% by mass, and more preferably in the range of 0.4 to 10% by mass based on the total amount of the ink.

<Other Components>

The ink of the present invention may further contain other components including a polymerization inhibitor and a surfactant as long as the effects of the present invention can be obtained. The ink of the present invention may contain only one of these components, or may contain two or more thereof.

(Polymerization Inhibitor)

Specific examples of the polymerization inhibitors include (alkyl)phenol, hydroquinone, catechol, resorcin, p-methoxyphenol, t-butylcatechol, t-butylhydroquinone, pyrogallol, 1,1-picrylhydrazyl, phenothiazine, p-benzoquinone, nitrosobenzene, 2,5-di-tert-butyl-p-benzoquinone, dithiobenzoyl disulfide, picric acid, cupferron, aluminum N-nitrosophenylhydroxylamine, tri-p-nitrophenylmethyl, N-(3-oxyanilino-1,3-dimethylbutylidene)aniline oxide, dibutylcresol, cyclohexanone oxime cresol, guaiacol, o-isopropylphenol, butyraldoxime, methyl ethyl ketoxime, and cyclohexanone oxime.

Examples of commercially available products of the polymerization inhibitor include Irgastab UV10 (manufactured by BASF Japan Ltd.) and Genorad 18 (manufactured by Rahn A.G.).

The amount of the polymerization inhibitor can be arbitrarily set as long as the effects of the present invention can be obtained.

The amount of the polymerization inhibitor may be, for example, 0.001% by mass or more and less than 1.0% by mass based on the total mass of the ink.

(Surfactant)

Examples of the surfactant include anionic surfactants such as dialkyl sulfosuccinates, alkylnaphthalene sulfonates, and fatty acid salts, nonionic surfactants such as polyoxyethylene alkyl ethers, polyoxyethylene alkyl allyl ethers, acetylene glycols, and polyoxyethylene/polyoxypropylene block copolymers, cationic surfactants such as alkylamine salts and quaternary ammonium salts, and silicone or fluorine surfactants.

Examples of the silicone-based surfactant include polyether-modified polysiloxane compounds, specifically Tego rad 2250, manufactured by Evonik, KF-351A, KF-352A, KF-642, and X-22-4272, manufactured by Shin-Etsu Chemical Co., Ltd., BYK 307, BYK 345, BYK 347, and BYK 348, manufactured by BYK-Chemie ("BYK" is a registered trademark of this company), and TSF 4452, manufactured by Momentary Performance Materials.

The fluorine-based surfactants are those where some or all of hydrogen atoms bonding to the carbon of hydrophobic groups of ordinary surfactants are replaced with fluorine atoms.

Examples of the fluorine-based surfactant include Megafac F manufactured by DIC Corporation ("Megafac" is a registered trademark of this company); Surflon manufactured by Asahi Glass Co., Ltd. ("Surflon" is a registered trademark of this company); Fluorad FC manufactured by 3M Company ("Fluorad" is a registered trademark of this company); Monflor manufactured by Imperial Chemical Industries; Zonyls manufactured by E. I. du Pont de Nemours and Company; Licowet VPF manufactured by Hoechst AG; and FTERGENT manufactured by NEOS COMPANY LIMITED ("FTERGENT" is a registered trademark of this company).

The amount of the surfactant can be arbitrarily set as long as the effects of the present invention can be obtained. The amount of the surfactant may be, for example, 0.001% by mass or more and less than 1.0% by mass based on the total mass of the ink.

<Curing Accelerator>

In the present invention, a curing accelerator may be contained as necessary. The curing accelerator can be used without particular limitation as long as it promotes the thermal curing of the resin component.

Examples of the curing accelerator include imidazoles, dicyandiamide derivatives, dicarboxylic acid dihydrazide, triphenylphosphine, tetraphenylphosphonium tetraphenylborate, 2-ethyl-4-methylimidazole-tetraphenylborate, and 1,8-diazabicyclo[5.4.0]undecene-7-tetraphenylborate.

<Coupling Agent>

In the present invention, various coupling agents may be contained as necessary. By containing the coupling agent, the adhesion with the copper foil can be improved.

Examples of the various coupling agents include silane-based, titanium-based, and aluminum-based coupling agents.

<Ion Scavenger>

In the present invention, an ion scavenger may be contained as necessary. The inclusion of an ion scavenger has advantages such as adsorption of ionic impurities and improved insulation properties under conditions where the cured film absorbs moisture.

Examples of the ion scavenger include inorganic ion adsorbents such as triazine thiol compounds, bisphenol-based reducing agents, zirconium compounds, and antimony bismuth-based magnesium aluminum compounds.

<Solvent>

In the ink of the present invention, a solvent-free ink is inherently preferable from the viewpoint of curability, but it can also be added to adjust the ink viscosity.

(Physical Properties)

The viscosity at 25° C. of the ink of the present invention is preferably in the range of 1 to $1 \times 10^4$ Pa·s from the viewpoint that the ink is sufficiently gelled and the pinning property becomes good when the ink is landed and the temperature is decreased to normal temperature.

Further, from the viewpoint of further enhancing the discharging property from the ink-jet head, the viscosity of the ink of the present invention at 80° C. is preferably in the range of 3 to 20 mPa·s, and more preferably in the range of 7 to 9 mPa·s.

The ink of the present invention preferably has a phase transition point in the range of 40° C. or more and less than 100° C. When the phase transition point is 40° C. or more, the ink rapidly gels after landing on the recording medium, so that the pinning property is further improved. Further, when the phase transition point is less than 100° C., the ink handling property becomes good and the ejection stability is improved.

From the viewpoint of enabling ink to be discharged at a lower temperature and reducing the load on the image forming apparatus, the phase transition point of the ink of the present invention is more preferably in the range of 40 to 60° C.

The viscosity at 80° C., the viscosity at 25° C. and the phase transition point of the ink of the present invention can be determined by measuring the temperature change of the dynamic viscoelasticity of the ink with a rheometer.

In the present invention, these viscosities and phase transition point are values obtained by the following methods.

The ink of the present invention is heated to 100° C., and while measuring its viscosity with a stress-controlled rheometer, Physica MCR301 (diameter of cone plate: 75 mm, cone angle: 1.0°), manufactured by Anton Paar GmbH, the ink is cooled to 20° C. under conditions of a shear rate of 11.7 (l/s) and a cooling rate of 0.1° C./s, and thus, a viscosity-temperature curve is obtained.

The viscosity at 80° C. and the viscosity at 25° C. can be obtained reading viscosities at 80° C. and 25° C. on the viscosity-temperature curve. The phase transition point can be obtained as a temperature at which the viscosity is 200 mPa·s on the viscosity-temperature curve.

From the viewpoint of further enhancing the discharging property from the ink-jet head, the average dispersed particle size of the pigment particles according to the present invention is preferably in the range of 50 to 150 nm, and the maximum particle size is preferably in the range of 300 to 1000 nm. A still more preferable average dispersed particle size is in the range of 80 to 130 nm.

An average dispersed particle size of a pigment particle in the present invention means a value obtained by a dynamic light scattering method using Zetasizer Nano ZSP, manufactured by Malvern Instruments. Incidentally, since an ink containing a colorant has such a high concentration that light is not transmitted therethrough in using this measuring apparatus, the ink is diluted 200 times before the measurement. The measurement temperature is set to normal temperature (25° C.).

[Method of Forming Solder Resist Film]

The thermally curable ink-jet ink of the present invention is preferably an ink for forming a solder resist pattern used for a printed circuit board. When a solder resist pattern (solder resist film) is formed using the thermally curable ink-jet ink of the present invention, it is possible to prevent the permeation of moisture into the solder resist film, and as a result, the adhesion between the copper foil and the solder resist film interface on the printed circuit board becomes good, the migration of copper is prevented, and a decrease in insulation properties can also be suppressed.

The method for forming a solder resist film using the thermally curable ink-jet ink of the present invention preferably includes (1) a step of discharging the ink of the present invention from a nozzle of an ink-jet head to land the ink on a printed circuit board on which a circuit is formed, and (3) a step of heating the ink for main curing.

When the ink of the present invention contains a compound having a photopolymerizable functional group and a photopolymerization initiator, it is preferable to include a step (step (2)) of irradiating the landed ink with an active ray and temporarily curing the ink between the steps (1) and (3).

<Step (1)>

In the step (1), droplets of the ink of the present invention are discharged from an ink-jet head and landed on a printed circuit board, which is a recording medium, at a position corresponding to a resist film to be formed, and patterning is performed.

The discharge method from the ink-jet head may be either an on-demand system or a continuous system.

The ink-jet head of the on-demand system may be any of electromechanical transduction systems of a single cavity type, a double cavity type, a bender type, a piston type, a share mode type, a shared-wall type, and the like, and thermoelectric transduction systems of a thermal ink-jet type, a Bubble Jet (Bubble Jet is a registered trademark of Canon Inc.) type, and the like.

Discharging stability of the ink droplet can be increased by discharging the droplet in a heated state from the ink-jet head. The temperature of the ink in discharging is preferably in the range of 40 to 100° C., and for further enhancing the discharging stability, is more preferably in the range of 40 to 90° C. In particular, it is preferable to perform the injection at an ink temperature such that the viscosity of the ink is in the range of 7 to 15 mPa·s, more preferably in the range of 8 to 13 mPa·s.

In a sol-gel phase transition type ink, in order to enhance a discharging property of the ink from an ink-jet head, when the ink is filled in the ink-jet head, the temperature of the ink is preferably set to (gelation temperature of the ink+10°) C. to (gelling temperature of the ink+30°) C. When the temperature of the ink in the ink-jet head is lower than (gelation temperature+10°) C., the ink becomes gel in the ink-jet head or on a nozzle surface, and the discharging property of the ink tends to decrease. Meanwhile, when the temperature of the ink in the ink jet head exceeds (gelation temperature+30°) C., the temperature of the ink becomes too high, and an ink component may be deteriorated.

The method of heating the ink is not particularly limited. For example, at least one of an ink supply system such as an ink tank constituting a head carriage, a supply pipe, or a front chamber ink tank just in front of a head, piping with a filter, and a piezo head can be heated with a panel heater, a ribbon heater, or a heat-retaining water.

The amount of ink droplets discharged is preferably in the range of 2 to 20 pL from viewpoints of recording speed and image quality.

The printed circuit board is not particularly limited, but is preferably a copper-clad laminate of all grades (FR-4 and the like) employing materials such as copper-clad laminates for high frequency circuit in which paper phenol, paper epoxy, glass fabric epoxy, glass polyimide, glass fabric/nonwoven fabric epoxy, glass fabric/paper epoxy, synthetic fiber epoxy, and fluorine/polyethylene/PPO/cyanate esters are used, a polyimide film, a PET film, a glass substrate, a ceramic substrate, a wafer plate, a stainless steel plate, or the like.

<Step (2)>

In the step (2), the ink landed in the step (1) is irradiated with an active ray to temporarily cure the ink.

The active ray can be selected from, for example, electron beam, ultraviolet rays, α-rays, γ-rays, X-rays and the like, and is preferably ultraviolet rays.

The irradiation of ultraviolet rays can be performed under the condition of a wavelength of 395 nm using a water-cooled LED manufactured by Phoseon Technology, for example. By using an LED as a light source, it becomes possible to suppress the occurrence of curing deficiency of the ink as a result of melting of the ink due to radiation heat of the light source.

The irradiation of ultraviolet rays is performed such that the peak illuminance of ultraviolet rays having a wavelength of 370 to 410 nm on the surface of the resist film is preferably 0.5 to 10 W/cm$^2$, and more preferably 1 to 5 W/cm$^2$. From the viewpoint of preventing the ink from being irradiated with radiation heat, the amount of light to irradiate the resist film is preferably less than 500 mJ/cm$^2$.

The irradiation of the active ray is performed preferably within a time period of from 0.001 to 300 second after the landing of the ink, and more preferably within a time period of 0.001 to 60 second or less after the landing, in order to form a high-definition resist film.

<Step (3)>

In the step (3), after the temporary curing of (2), the ink is further heated for main curing.

The heating method is preferably, for example, to charge into an oven set in a range of 110 to 180° C. for 10 to 60 minutes.

The thermally curable ink jet ink of the present invention can be used not only as the ink for forming a solder resist pattern described above, but also as an adhesive, a sealing agent, a circuit protectant, and the like for electronic components.

EXAMPLES

Hereinafter, the present invention will be specifically described with reference to examples, but the present invention is not limited thereto. In the following examples, unless otherwise specified, the operations were performed at room temperature (25° C.). Unless otherwise specified, "%" and "part" mean "% by mass" and "parts by mass", respectively.

<Preparation of Yellow Pigment Dispersion>

The following dispersant 1, dispersant 2, and dispersion medium were placed in a stainless steel beaker, heated on a hot plate at 65° C., stirred and dissolved for 1 hour, cooled to room temperature, and then the following pigment was added thereto, and the mixture was placed in a glass bottle together with 200 g of zirconia beads having a diameter of 0.5 mm and sealed tightly. This was dispersed using a paint shaker until the desired particle size was achieved, and the zirconia beads were removed.

Dispersant 1: EFKA7701 (manufactured by BASF Japan Ltd.) 5.6 parts by mass

Dispersant 2: Solsperce 22000 (manufactured by The Lubrizol Corporation) 0.4 parts by mass Dispersion medium: dipropylene glycol diacrylate (containing 0.2% UV-10) 80.6 parts by mass Pigment: PY185 (manufactured by BASF Japan Ltd., Paliotol Yellow D1155) 13.4 parts by mass <Preparation of Cyan Pigment Dispersion>

In the preparation of the yellow pigment dispersion, the dispersant, the dispersion medium and the pigment were prepared in the same manner except that they were changed as shown below.

Dispersant: EFKA7701 (manufactured by BASF Japan Ltd.) 7 parts by mass

Dispersion medium: dipropylene glycol diacrylate (containing 0.2% UV-10) 70 parts by mass Pigment: PB15:4 (manufactured by Dainichiseika Color & Chemicals Mfg. Co., Ltd., Chromofine Blue 6332JC) 23 parts by mass <Gelling Agent>

The following gelling agents were used.

distearyl ketone (denoted as d1 in the table below)

behenyl behenate (denoted as d2 in the table below)

<Compound having Thermally Curable Functional Group>

Those shown in Table I above were used.

TABLE I

| | Thermally curable functional group | Trade name | Company name | Blocking agent | Name | |
|---|---|---|---|---|---|---|
| Compound having thermally curable functional group | hydroxy group | Epoxy Ester M-600A | Kyoei Kagaku Kogyo | — | 2-hydroxy-3-phenoxypropyl acrylate | a1 |
| | | HOA-MPE(N) | Kyoei Kagaku Kogyo | — | 2-acryloyloxyethyl-2-hydroxyethyl-phthalic acid | a2 |
| | carboxy group | LIGHT ACRYALTE HOA-HH | Kyoei Kagaku Kogyo | — | 2-acryloyloxyethyl hexahydrophthalic acid | a3 |
| | | M-5400 | Toagosei Co., Ltd. | — | monohydroxyethyl phthalate acrylate | a4 |
| | isocyanate group | Karenz MOI | SHOWA DENKO K.K. | — | 2-methacryloyloxyethyl isocyanate | a5 |
| | | Karenz MOI-BP | SHOWA DENKO K.K. | — | 2-[(3,5-dimethylpyrazolyl)carbonyl-amino] ethyl methacrylate | a6 |
| | | Karenz MOI-BM | SHOWA DENKO K.K. | — | 2-(0-[1'-methylpropylidencamino]carboxy-amino)ethyl methacrylate | a7 |
| | poly-functional block isocyanate | TrixeneB17961 | LANXESS | DMP (pyrazole-based) | — | a8 |
| | | TrixeneB17982 | LANXESS | DMP | — | a9 |
| | | TrixeneB17992 | LANXESS | DMP/DEM(/activated ethylene-based) | — | a10 |
| | | PU5211 | Leeson Polyurethanes | MEKO (oxime-based) | — | a11 |
| | | VESTANATB1186A | Evonik | — | e-caprolactam | a12 |
| | epoxy group | EA-1010N | SHIN-NAKAMURA CHEMICAL Co., Ltd. | — | glycidyl ether-containing epoxy acrylate bisphenol A skeleton | a13 |
| | | YX-4000 | Mitsubishi Chemical Corporation | — | biphenyl type epoxy | a14 |
| | | EP-4901HF | ADEKA | — | BPF type | a15 |
| | | EP-3950L | ADEKA | — | p-aminophenol type | a16 |
| | | JER825 | Mitsubishi Chemical Corporation | — | bisphenol A type epoxy resin | a17 |

TABLE I-continued

| Thermally curable functional group | Trade name | Company name | Blocking agent | Name | |
|---|---|---|---|---|---|
| acrylic group | M290 | Miwon | — | BPF(EO)4DA | a18 |
| | PE110H | Miwon | — | Phenolepoxyacrylate | a19 |
| | FA-513SA | Hitachi Chemical Company, Ltd. | — | dicyclopentanyl acrylate | a20 |
| imido-acrylate | M140 | Toagosei Co., Ltd. | — | cyclohexanedicarboxyimide ethyl acrylate | a21 |
| | PU2100 | Miwon | — | urethane acrylate | a22 |
| | AH-600 | Kyoei Kagaku Kogyo | — | urethane acrylate | a23 |
| | DAP-K | OSAKA SODA CO., LTD. | — | diallyl phthalate | a24 |
| maleimide group | BMI-4000 | Daiwa Kasei Industry Co., Ltd. | — | bisphenol-A diphenyl ether terbismaleimide | a25 |
| | BMI-80 | K.I Chemical Industry Co., LTD. | — | 2,2'-Bis-[4-(4-maleimidephenoxy)phenyl]propane | a26 |
| mercapto group | Karenz MTNR 1 | SHOWA DENKO K.K. | — | 1,3,5-tris(3-mercaptobutyryloxyethyl)-1,3,5-triazine 2,4,6(1H,3H,5H)-trione | a27 |
| alkoxy group | Nikalac MX-302 | SANWA CHEMICAL CO., LTD. | — | acrylic modified alkylated melamine | a28 |

<Compound having Photopolymerizable Functional Group>

As the compound having a photopolymerizable functional group, those shown in Table II below were used.

TABLE II

| | Type | Trade name | Company name | |
|---|---|---|---|---|
| Compound having photopolymerizable functional group | DPGDA | M222 | Miwon | c 1 |
| | TMP(EO)9TA | EM2382 | Eternal Materials Co., Ltd. | c 2 |
| Thermal curing aid | carbodiimide group-containing curing agent | Carbodilite V-05 | Nissin Chemical Industry Co., Ltd. | b 1 |
| | oxazoline group-containing curing agent | EPOCROS RPS-1005 | NIPPON SHOKUBAI CO., LTD. | b 2 |
| | imidazole-based | 2E4MZ | SHIKOKU CHEMICALS CORPORATION | b 3 |
| | imidazole-based | C11Z-CN | | b 4 |
| | imidazole-based | EH-2021 | ADEKA | b 5 |
| | aromatic amine | EH-105L | ADEKA | b 6 |
| | ketimine-based | EH-235R-2 | ADEKA | b 7 |
| | acid anhydride | HN-2200 | Hitachi Chemical Company, Ltd. | b 8 |
| | latent curing agent dicyandiamide type | EH-3636AS | ADEKA | b 9 |
| | dialyl compound | 2,2'-diallylbisphenol A | Daiwa Kasei Industry Co., Ltd. | b10 |

<Photopolymerization Initiator>

The following photopolymerization initiators were used.
TPO (manufactured by BASF Japan Ltd.)

<Photosensitizer>

The following photosensitizers were used.
ITX (manufactured by Lambson)

<Thermal Curing Aid>

Those shown in Table II above were used.

<Preparation of Ink-Jet Ink>

The inks were prepared according to the ink composition listed in Tables below and filtered through a Teflon 3-µm membrane filter manufactured by ADVATEC. The viscosity at 80° C. and the gel phase transition temperature of each ink were measured with a viscoelasticity meter MCR300 manufactured by Physica Messtechnik GmbH at a shear rate of 1000 (1/s).

The gel phase transition temperature here represents a temperature at a complex viscosity of 1 Pa or more in the viscoelasticity curve which is obtained by changing the temperature at a cooling rate of 0.1° C./s, a strain of 5%, an angular frequency of 10 radian/s, and a cooling rate of 0.1° C./s.

The viscosity at 25° C. of each of the inks of the present invention was 1 to $1\times10^4$ Pa·s, whereas the viscosity of each of Comparative Examples was less than 1 Pas.

Further, the gel phase transition temperature of each of the inks of the present invention was 40 to 100° C., but the gel phase transition phenomenon was not observed in the inks of Comparative Examples.

The symbols (a1 to a28, b1 to b10, c1, and c2) in the right column in Table I and Table II were assigned corresponding to each trade name.

TABLE III

Unit: [parts by mass]

| Ink NO. | | 1 | 2 | 3 | 4 | 5 | 6 | 7 | 8 | 9 |
|---|---|---|---|---|---|---|---|---|---|---|
| Yellow pigment dispersion | | 3.0 | 3.0 | 3.0 | 3.0 | 3.0 | 3.0 | 3.0 | 3.0 | 3.0 |
| Cyan pigment dispersion | | 1.0 | 1.0 | 1.0 | 1.0 | 1.0 | 1.0 | 1.0 | 1.0 | 1.0 |
| gelling agent | d 1 | 1.1 | 1.1 | 1.1 | 1.1 | 1.1 | 1.1 | 1.1 | 1.1 | 1.1 |
| | d 2 | 1.2 | 1.2 | 1.2 | 1.2 | 1.2 | 1.2 | 1.2 | 1.2 | 1.2 |
| Compound having thermally curable functional group | a 1 | 30.0 | — | — | — | — | — | — | — | — |
| | a 2 | — | 30.0 | — | — | — | — | — | — | — |
| | a 3 | — | — | 20.0 | — | — | — | — | — | — |
| | a 4 | — | — | — | 20.0 | — | — | — | — | — |
| | a 5 | — | — | — | — | 10.0 | — | — | — | — |
| | a 6 | — | — | — | — | — | 10.0 | — | — | — |
| | a 7 | — | — | — | — | — | — | 10.0 | — | — |
| | a 8 | 10.0 | — | — | — | — | — | — | — | — |
| | a 9 | — | — | — | — | — | — | — | 10.0 | — |
| | a10 | — | — | — | — | — | — | — | — | 10.0 |
| | a11 | — | 10.0 | — | — | — | — | — | — | — |
| | a12 | — | — | — | — | — | — | — | — | — |
| | a13 | — | — | — | — | 20.0 | — | — | — | — |
| | a14 | — | — | — | — | — | 30.0 | — | — | — |
| | a15 | — | — | — | — | — | — | 30.0 | 20.0 | — |
| | a16 | — | — | — | — | — | — | — | — | 30.0 |
| | a17 | — | — | — | — | — | — | — | — | — |
| | a18 | — | — | — | — | — | — | — | — | — |
| | a19 | — | — | — | — | — | — | — | — | — |
| | a20 | — | — | — | — | — | — | — | — | — |
| | a21 | — | — | — | — | — | — | — | — | — |
| | a22 | — | 10.0 | — | — | — | — | — | — | — |
| | a23 | 10.0 | — | — | — | — | — | — | — | — |
| | a24 | — | — | — | — | — | — | — | — | — |
| | a25 | — | — | — | — | — | — | — | — | — |
| | a26 | — | — | — | — | — | — | — | — | — |
| | a27 | — | — | — | — | — | — | — | — | — |
| | a28 | — | — | — | — | — | — | — | — | — |
| Compound having photopolymerizable functional group | c 1 | 0.0 | 37.7 | 52.7 | 47.7 | 57.7 | 47.7 | 37.7 | 57.7 | 47.7 |
| | c 2 | 10.0 | — | 10.0 | — | — | — | 10.0 | — | — |
| Photoinitiator | | 3.0 | 3.0 | 5.0 | 5.0 | 3.0 | 3.0 | 3.0 | 3.0 | 3.0 |
| Photosensitizer | | 3.0 | 3.0 | 1.0 | 1.0 | 3.0 | 3.0 | 3.0 | 3.0 | 3.0 |
| Thermal curing aid | b 1 | — | — | 5.0 | — | — | — | — | — | — |
| | b 2 | — | — | — | 20.0 | — | — | — | — | — |
| | b 3 | — | — | — | — | — | — | — | — | — |
| | b 4 | — | — | — | — | — | — | — | — | — |
| | b 5 | — | — | — | — | — | — | — | — | — |
| | b 6 | — | — | — | — | — | — | — | — | — |
| | b 7 | — | — | — | — | — | — | — | — | — |
| | b 8 | — | — | — | — | — | — | — | — | — |
| | b 9 | — | — | — | — | — | — | — | — | — |
| | b10 | — | — | — | — | — | — | — | — | — |
| Remarks | | Inventive | Inventive | Inventive | Inventive | Inventive | Inventive | Inventive | Inventive | Inventive |

TABLE IV

Unit: [parts by mass]

| Ink NO. | | 10 | 11 | 12 | 13 | 14 | 15 | 16 | 17 | 18 |
|---|---|---|---|---|---|---|---|---|---|---|
| Yellow pigment dispersion | | 3.0 | 3.0 | 3.0 | 3.0 | 3.0 | 3.0 | 3.0 | 3.0 | 3.0 |
| Cyan pigment dispersion | | 1.0 | 1.0 | 1.0 | 1.0 | 1.0 | 1.0 | 1.0 | 1.0 | 1.0 |
| gelling agent | d 1 | 1.1 | 1.1 | 1.1 | 1.1 | 1.1 | 1.1 | 1.1 | 1.1 | 1.1 |
| | d 2 | 1.2 | 1.2 | 1.2 | 1.2 | 1.2 | 1.2 | 1.2 | 1.2 | 1.2 |
| Compound having thermally curable functional group | a 1 | — | — | — | — | — | — | — | — | — |
| | a 2 | — | — | — | — | — | — | — | — | — |
| | a 3 | — | — | — | — | — | — | — | — | — |
| | a 4 | — | — | — | — | — | — | — | — | — |
| | a 5 | — | — | — | — | — | — | — | — | — |
| | a 6 | — | — | — | — | — | — | — | — | — |
| | a 7 | — | — | — | — | — | — | — | — | — |
| | a 8 | — | 20.0 | 10.0 | — | — | — | 5.0 | — | — |

TABLE IV-continued

Unit: [parts by mass]

| Ink NO. | | 10 | 11 | 12 | 13 | 14 | 15 | 16 | 17 | 18 |
|---|---|---|---|---|---|---|---|---|---|---|
| | a9 | — | — | — | — | — | 25.0 | — | 5.0 | — |
| | a10 | — | — | — | — | 5.0 | — | — | — | — |
| | a11 | — | — | — | — | — | — | — | — | — |
| | a12 | 10.0 | — | — | — | — | — | — | — | — |
| | a13 | — | — | — | — | — | — | — | — | — |
| | a14 | — | — | — | — | — | — | — | — | — |
| | a15 | — | — | — | — | — | — | — | — | 30.0 |
| | a16 | — | — | — | 28.5 | — | — | — | — | — |
| | a17 | 10.0 | — | — | — | — | — | — | — | — |
| | a18 | — | 20.0 | — | — | — | — | — | — | — |
| | a19 | — | — | 25.0 | — | — | — | — | — | — |
| | a20 | — | — | — | — | 30.0 | — | — | — | — |
| | a21 | — | — | — | — | — | — | 50.0 | 25.0 | — |
| | a22 | — | — | — | — | 10.0 | 15.0 | — | — | — |
| | a23 | — | — | — | — | — | — | — | — | — |
| | a24 | — | — | — | — | — | — | — | 15.0 | — |
| | a25 | — | — | — | — | — | — | — | — | — |
| | a26 | — | — | — | — | — | — | — | — | — |
| | a27 | — | — | — | — | — | — | — | — | — |
| | a28 | — | — | — | — | — | — | — | — | — |
| Compound having photopolymerizable functional group | c1 | 67.7 | 47.7 | 42.7 | 47.7 | 42.7 | 47.7 | 32.7 | 42.7 | 27.7 |
| | c2 | — | — | 10.0 | 10.0 | — | — | — | — | 5.0 |
| Photoinitiator | | 3.0 | 3.0 | 3.0 | 5.0 | 3.0 | 3.0 | 3.0 | 3.0 | 5.0 |
| Photosensitizer | | 3.0 | 3.0 | 3.0 | 1.0 | 3.0 | 3.0 | 3.0 | 3.0 | 1.0 |
| Thermal curing aid | b1 | — | — | — | — | — | — | — | — | — |
| | b2 | — | — | — | — | — | — | — | — | — |
| | b3 | — | — | — | 1.5 | — | — | — | — | — |
| | b4 | — | — | — | — | — | — | — | — | — |
| | b5 | — | — | — | — | — | — | — | — | 1.0 |
| | b6 | — | — | — | — | — | — | — | — | — |
| | b7 | — | — | — | — | — | — | — | — | — |
| | b8 | — | — | — | — | — | — | — | — | 24.0 |
| | b9 | — | — | — | — | — | — | — | — | — |
| | b10 | — | — | — | — | — | — | — | — | — |
| Remarks | | Inventive | Inventive | Inventive | Inventive | Inventive | Inventive | Inventive | Inventive | Inventive |

TABLE V

Unit: [parts by mass]

| Ink NO. | | 19 | 20 | 21 | 22 | 23 | 24 | 25 | 26 | 27 |
|---|---|---|---|---|---|---|---|---|---|---|
| Yellow pigment dispersion | | 3.0 | 3.0 | 3.0 | 3.0 | 3.0 | 3.0 | 3.0 | 3.0 | 3.0 |
| Cyan pigment dispersion | | 1.0 | 1.0 | 1.0 | 1.0 | 1.0 | 1.0 | 1.0 | 1.0 | 1.0 |
| gelling agent | d1 | 1.1 | 1.1 | 1.1 | 1.1 | 1.1 | 1.1 | 1.1 | 1.1 | 1.1 |
| | d2 | 1.2 | 1.2 | 1.2 | 1.2 | 1.2 | 1.2 | 1.2 | 1.2 | 1.2 |
| Compound having thermally curable functional group | a1 | — | — | — | — | — | 10.0 | — | — | — |
| | a2 | — | — | — | — | — | — | — | — | — |
| | a3 | — | — | — | — | — | — | — | — | — |
| | a4 | — | — | — | — | — | — | — | — | — |
| | a5 | — | — | — | — | — | — | — | — | — |
| | a6 | — | — | — | — | — | — | — | — | — |
| | a7 | — | — | — | — | — | — | — | — | — |
| | a8 | — | — | — | — | — | — | — | — | 10.0 |
| | a9 | — | — | — | — | — | — | 5.0 | — | — |
| | a10 | — | — | — | — | — | — | — | — | — |
| | a11 | — | — | — | — | — | — | — | — | — |
| | a12 | — | — | — | — | — | — | — | — | — |
| | a13 | — | — | — | — | — | — | — | — | — |
| | a14 | 30.0 | — | — | — | 20.0 | — | — | — | — |
| | a15 | — | 30.0 | — | 30.0 | — | — | — | 15.0 | — |
| | a16 | — | — | — | — | — | — | — | — | — |
| | a17 | — | — | — | — | — | — | — | — | — |
| | a18 | — | — | — | — | — | — | — | 15.0 | — |
| | a19 | — | — | — | — | — | — | — | — | — |
| | a20 | — | — | — | — | — | — | — | — | 25.0 |
| | a21 | — | — | — | — | — | — | 50.0 | — | — |
| | a22 | — | — | — | — | — | — | — | — | — |
| | a23 | — | — | — | — | — | — | — | — | — |
| | a24 | — | — | — | — | — | — | — | — | 15.0 |
| | a25 | — | — | 15.0 | — | — | — | — | — | — |
| | a26 | — | — | — | 10.0 | — | — | — | — | — |

TABLE V-continued

Unit: [parts by mass]

| Ink NO. | | 19 | 20 | 21 | 22 | 23 | 24 | 25 | 26 | 27 |
|---|---|---|---|---|---|---|---|---|---|---|
| | a27 | — | — | — | — | 15.0 | — | — | — | — |
| | a28 | — | — | — | — | — | 20.0 | — | — | — |
| Compound having photopolymerizable functional group | c 1 | 56.2 | 51.7 | 57.7 | 46.7 | 52.7 | 57.7 | 32.7 | 46.2 | 37.7 |
| | c 2 | — | — | — | — | — | — | — | 10.0 | — |
| Photoinitiator | | 5.0 | 5.0 | 5.0 | 5.0 | 3.0 | 3.0 | 3.0 | 5.0 | 3.0 |
| Photosensitizer | | 1.0 | 1.0 | 1.0 | 1.0 | 3.0 | 3.0 | 3.0 | 1.0 | 3.0 |
| Thermal curing aid | b 1 | — | — | — | — | — | — | — | — | — |
| | b 2 | — | — | — | — | — | — | — | — | — |
| | b 3 | — | — | — | 1.0 | — | — | — | 1.5 | — |
| | b 4 | 1.5 | — | — | — | — | — | — | — | — |
| | b 5 | — | — | — | — | — | — | — | — | — |
| | b 6 | — | — | — | — | — | — | — | — | — |
| | b 7 | — | — | — | — | — | — | — | — | — |
| | b 8 | — | — | — | — | — | — | — | — | — |
| | b 9 | — | 6.0 | — | — | — | — | — | — | — |
| | b10 | — | — | 15.0 | — | — | — | — | — | — |
| Remarks | | Inventive | Inventive | Inventive | Inventive | Inventive | Inventive | Inventive | Inventive | Inventive |

TABLE VI

Unit: [parts by mass]

| Ink NO. | | 28 | 29 | 30 | 31 | 32 | 33 | 34 | 35 |
|---|---|---|---|---|---|---|---|---|---|
| Yellow pigment dispersion | | 3.0 | 3.0 | 3.0 | 3.0 | 3.0 | 3.0 | 3.0 | 3.0 |
| Cyan pigment dispersion | | 1.0 | 1.0 | 1.0 | 1.0 | 1.0 | 1.0 | 1.0 | 1.0 |
| gelling agent | d 1 | 1.1 | 1.1 | 1.1 | 1.1 | — | — | — | — |
| | d 2 | 1.2 | 1.2 | 1.2 | 1.2 | — | — | — | — |
| Compound having thermally curable functional group | a 1 | — | — | — | — | — | — | — | — |
| | a 2 | — | — | — | — | — | — | — | — |
| | a 3 | — | — | — | — | — | — | — | — |
| | a 4 | — | — | — | — | — | — | — | — |
| | a 5 | — | — | — | — | 10.0 | — | — | — |
| | a 6 | — | — | — | — | — | — | — | — |
| | a 7 | — | — | — | — | — | — | — | — |
| | a 8 | — | 10.0 | 25.0 | — | — | — | — | — |
| | a 9 | 10.0 | — | — | — | — | — | — | 5.0 |
| | a10 | — | — | — | — | — | — | — | — |
| | a11 | — | — | — | — | — | — | — | — |
| | a12 | — | — | — | — | — | — | — | — |
| | a13 | — | — | — | — | 20.0 | — | — | — |
| | a14 | — | — | — | — | — | — | — | — |
| | a15 | — | — | 25.0 | 25.0 | — | — | 30.0 | — |
| | a16 | — | — | — | — | — | 28.5 | — | — |
| | a17 | — | — | — | — | — | — | — | — |
| | a18 | — | — | — | 25.0 | — | — | — | — |
| | a19 | — | — | — | — | — | — | — | — |
| | a20 | — | 48.7 | 43.7 | 42.2 | — | — | — | — |
| | a21 | 25.0 | 25.0 | — | — | — | — | — | 50.0 |
| | a22 | 15.0 | — | — | — | — | — | — | — |
| | a23 | — | — | — | — | — | — | — | — |
| | a24 | — | 10.0 | — | — | — | — | — | — |
| | a25 | — | — | — | — | — | — | — | — |
| | a26 | — | — | — | — | — | — | — | — |
| | a27 | — | — | — | — | — | — | — | — |
| | a28 | — | — | — | — | — | — | — | — |

TABLE VI-continued

Unit: [parts by mass]

| Ink NO. | | 28 | 29 | 30 | 31 | 32 | 33 | 34 | 35 |
|---|---|---|---|---|---|---|---|---|---|
| Compound having | c 1 | 37.7 | — | — | — | 60.0 | 50.0 | 30.0 | 35.0 |
| photopolymerizable | c 2 | — | — | — | — | — | 10.0 | 5.0 | — |
| functional group | | | | | | | | | |
| Photoinitiator | | 3.0 | — | — | — | — | 5.0 | 5.0 | 3.0 |
| Photosensitizer | | 3.0 | — | — | — | — | 1.0 | 1.0 | 3.0 |
| Thermal curing | b 1 | — | — | — | — | — | — | — | — |
| aid | b 2 | — | — | — | — | — | — | — | — |
| | b 3 | — | — | — | 1.5 | — | 1.5 | — | — |
| | b 4 | — | — | — | — | — | — | — | — |
| | b 5 | — | — | — | — | — | — | 1.0 | — |
| | b 6 | — | — | — | — | — | — | — | — |
| | b 7 | — | — | — | — | — | — | — | — |
| | b 8 | — | — | — | — | — | — | 24.0 | — |
| | b 9 | — | — | — | — | — | — | — | — |
| | b10 | — | — | — | — | — | — | — | — |
| Remarks | | Inventive | Inventive | Inventive | Inventive | Comparative Example | Comparative Example | Comparative Example | Comparative Example |

<Pattern Formation by Ink-Jet>

Each ink-jet ink prepared was loaded in an ink-jet recording apparatus having ink-jet recording heads each equipped with piezo type ink-jet nozzles. Using this apparatus, a pattern was formed on a copper-clad laminate for a printed wiring board (FR-4 thickness 1.6 mm, size 150 mm×95 mm).

The ink supplying system used had ink tanks, ink flow paths, sub-ink tanks immediately before the ink-jet recording heads, metal filter-attached piping, and piezo heads. The area from the ink tanks to the head portion was warmed to 90° C. The ink temperature in the recording head was warmed to 90° C. by heating using a heater disposed inside the piezo head. The piezo head had a nozzle diameter of 22 μm, and heads having a nozzle resolution of 360 dpi were arranged in a staggered pattern to form nozzle arrays of 720 dpi.

Using this ink-jet apparatus, a voltage was applied so that the amount of droplets would be dots of 6.0 pl, a solid pattern of 20 mm×50 mm and a comb pattern of 100 μm in line and space were printed on a substrate so that their respective thicknesses would be 20 μm, and then the ink layer was temporarily cured by irradiation with an LED lamp (395 nm, 8 W/cm², water cooled unit) manufactured by Phoseon Technology at 500 mJ/cm². After that, it was put into an oven set at 150° C. for 60 minutes for main curing, and a print sample was obtained.

[Evaluation]

<Substrate Adhesion>

With respect to the print sample of the solid pattern, cuts were made in a grid pattern in the cured film in accordance with the cross-cut method of JIS K5600, an adhesive tape was attached and peeled off, the peeled state of the cured film was observed, the adhesion residual ratio was determined by the following method, and evaluation was performed in accordance with the following criteria. Here, the adhesion residual rate is calculated using the number of squares created by making cuts as the denominator and the number of squares remaining in the tape peeling as the numerator.

(Criteria)

AA: Adhesion residual rate 100%

BB: Adhesion residual rate 80% or more and less than 100%

CC: Adhesion residual rate 60% or more and less than 80%

DD: Adhesion residual rate less than 60%<

<Heat and Moisture Resistance>

The print sample of the solid pattern was left to stand for 500 hours under the conditions of 85° C. and 85% relative humidity. Thereafter, the substrate adhesion was evaluated as described above, and the peeling state of the cured film was observed.

<Solvent Resistance>

The print sample of the solid pattern was immersed in propylene glycol monomethyl acetate at 20° C. for 20 minutes, washed with water and dried, and then the substrate adhesion was evaluated to observe the peeled state of the cured film.

<Acid Resistance>

The print sample of the solid pattern was immersed in a sulfuric acid aqueous solution of 10% by mass at 20° C. for 20 minutes, washed with water and dried, and then the substrate adhesion was evaluated to observe the peeled state of the cured film.

<Alkali Resistance>

The print sample of the solid pattern was immersed in a sodium hydroxide aqueous solution of 10% by mass at 20° C. for 20 minutes, washed with water and dried, and then the substrate adhesion was evaluated to observe the peeled state of the cured film.

<Solder Heat Resistance>

The print sample of the solid pattern was immersed in a solder bath at 260° C. three times for 10 seconds, and then the substrate adhesion was evaluated to observe the peeled state of the cured film.

<Insulation Reliability>

A conductive comb wiring pattern was formed on a copper-clad laminate (FR-4 thickness 1.6 mm, size 150 mm×95 mm) for a printed wiring board at a line and space of 75 and a solid pattern was formed by ink-jet using each ink-jet ink prepared so as to cover the entire comb wiring pattern. The obtained sample was evaluated for insulation up to 1000 hours under the conditions of applying 85° C., a relative humidity of 85% RH and 100 V, according to the following criteria.

(Criteria)

AA: There was no significant decrease in resistance value or short circuit after 1000 hours elapsed, and the insulation resistance value is $10^8 \Omega$ or more.

BB: There was no significant decrease in resistance value or short circuit after 500 hours elapsed, and the insulation resistance value is $10^8 \Omega$ or more.

CC: There was no significant decrease in resistance value or short circuit after 250 hours elapsed, and the insulation resistance value is $10^8 \Omega$ or more.

DD: The insulation resistance value was less than $10^8 \Omega$ before 250 hours elapsed.

TABLE VII

| Ink NO. | Adhesion with metal plate | Heat and moisture resistance | Solvent resistance | Acid resistance | Alkali resistance | Solder heat resistance | Insulation reliabiliy | Remarks |
|---|---|---|---|---|---|---|---|---|
| Ink | AA | AA | BB | BB | BB | BB | AA | Inventive |
| Ink 2 | AA | AA | AA | AA | AA | AA | AA | Inventive |
| Ink 3 | AA | AA | AA | AA | AA | AA | AA | Inventive |
| Ink 4 | AA | AA | AA | AA | AA | AA | AA | Inventive |
| Ink 5 | BB | AA | AA | AA | AA | AA | AA | Inventive |
| Ink 6 | AA | AA | AA | AA | AA | AA | AA | Inventive |
| Ink 7 | AA | AA | AA | AA | AA | AA | AA | Inventive |
| Ink 8 | AA | AA | AA | AA | AA | AA | AA | Inventive |
| Ink 9 | AA | AA | BB | BB | BB | BB | AA | Inventive |
| Ink 10 | AA | AA | AA | AA | AA | AA | AA | Inventive |
| Ink 11 | BB | AA | AA | AA | AA | AA | AA | Inventive |
| Ink 12 | AA | AA | BB | BB | BB | BB | AA | Inventive |
| Ink 13 | AA | AA | AA | AA | AA | AA | AA | Inventive |
| Ink 14 | AA | AA | AA | AA | AA | AA | AA | Inventive |
| Ink 15 | BB | AA | AA | AA | AA | AA | AA | Inventive |
| Ink 16 | AA | AA | AA | AA | AA | AA | AA | Inventive |
| Ink 17 | AA | AA | AA | AA | AA | AA | AA | Inventive |
| Ink 18 | AA | AA | AA | AA | AA | AA | AA | Inventive |
| Ink 19 | AA | AA | AA | AA | AA | AA | AA | Inventive |
| Ink 20 | AA | AA | AA | AA | AA | AA | AA | Inventive |
| Ink 21 | AA | AA | AA | AA | AA | AA | AA | Inventive |
| Ink 22 | AA | AA | AA | AA | AA | AA | AA | Inventive |
| Ink 23 | AA | AA | AA | AA | AA | AA | AA | Inventive |
| Ink 24 | AA | AA | BB | BB | BB | BB | AA | Inventive |
| Ink 25 | AA | AA | AA | AA | AA | AA | AA | Inventive |
| Ink 26 | BB | AA | AA | AA | AA | AA | AA | Inventive |
| Ink 27 | AA | AA | AA | AA | AA | AA | AA | Inventive |
| Ink 28 | AA | AA | AA | AA | AA | AA | AA | Inventive |
| Ink 29 | AA | AA | AA | AA | AA | AA | AA | Inventive |
| Ink 30 | BB | BB | BB | BB | BB | BB | AA | Inventive |
| Ink 31 | AA | AA | AA | AA | AA | AA | AA | Inventive |
| Ink 32 | AA | DD | CC | CC | CC | DD | DD | Comparative Example |
| Ink 33 | AA | DD | CC | CC | CC | DD | DD | Comparative Example |
| Ink 34 | AA | DD | CC | CC | CC | DD | DD | Comparative Example |
| Ink 35 | AA | DD | CC | CC | CC | DD | DD | Comparative Example |

As can be seen from the above results, the inks of the present invention are superior to the inks of Comparative Examples in terms of substrate adhesion, a heat and moisture resistance, solvent resistance, acid resistance, alkali resistance, solder heat resistance, and insulation reliability.

INDUSTRIAL APPLICABILITY

The present invention can be used for a thermally curable ink-jet ink capable of forming a coating film having excellent substrate adhesion, insulation reliability, a heat and moisture resistance, and various solvent resistances.

The invention claimed is:

1. A thermally curable ink-jet ink comprising:
a compound having a thermally curable functional group;
a gelling agent;
a compound having a photopolymerizable functional group; and
a photopolymerization initiator, wherein the thermally curable ink-jet ink undergoes a sol-gel phase transition depending on temperature, and
wherein the compound having the thermally curable functional group is (a) a polyfunctional isocyanate compound having an isocyanate group protected by a thermally dissociable blocking agent, or (b) a (meth) acrylate compound having an imide group, wherein the gelling agent is at least one compound selected from compounds represented by the following general formula (G1) or (G2):

$$R_1-CO-R_2 \quad \text{General formula (G1):}$$

$$R_3-COO-R_4 \quad \text{General formula (G2):}$$

wherein $R_1$ to $R_4$ each independently represent an alkyl chain having a linear portion having 12 or more carbon atoms and optionally having a branch.

2. The thermally curable ink-jet ink according to claim 1, wherein the thermally dissociable blocking agent is at least one compound selected from the group consisting of an oxime-based compound, a pyrazole-based compound, and an active ethylene-based compound.

3. The thermally curable ink-jet ink according to claim 1, wherein the ink has a viscosity at 25° C. in the range of 1 to $1 \times 10^4$ Pa·s, and a phase transition point of 40° C. or more and less than 100° C.

4. The thermally curable ink-jet ink according to claim 1, which is an ink for forming a solder resist pattern used for a printed circuit board.

* * * * *